United States Patent [19]

Shu et al.

[11] Patent Number: 4,634,894

[45] Date of Patent: Jan. 6, 1987

[54] LOW POWER CMOS REFERENCE GENERATOR WITH LOW IMPEDANCE DRIVER

[75] Inventors: Lee-Lean Shu, Milpitas; Tai C. Shyu, San Jose; Patrick T. Chuang, Cupertino, all of Calif.

[73] Assignee: Advanced Micro Devices, Inc., Sunnyvale, Calif.

[21] Appl. No.: 707,726

[22] Filed: Mar. 4, 1985

[51] Int. Cl.[4] .............................................. G05F 3/24
[52] U.S. Cl. .................... 307/297; 307/296 R; 307/491; 307/496; 307/548; 323/313
[58] Field of Search .................. 323/313–314; 330/277, 296; 307/296 R, 297, 491, 496, 497, 542, 547, 548, 552, 553, 554

[56] References Cited

U.S. PATENT DOCUMENTS

| | | | |
|---|---|---|---|
| 4,061,962 | 12/1977 | Stewart | 323/313 X |
| 4,264,874 | 4/1981 | Young | 330/277 |
| 4,453,094 | 6/1984 | Peil et al. | 307/297 X |
| 4,595,844 | 6/1986 | Shen | 307/296 R X |

FOREIGN PATENT DOCUMENTS

| | | | |
|---|---|---|---|
| 0014149 | 8/1980 | European Pat. Off. | 323/313 |
| 0155628 | 9/1982 | Japan | 323/313 |

OTHER PUBLICATIONS

Tsividis et al., "A CMOS Voltage Reference", *IEEE J.S.S.C.*, vol. SC-13, No. 6, 12-1978, pp. 774–778.
Blauschild et al, "A New NMOS Temperature Stable Voltage Reference", *IEEE J.S.S.C.*, vol. SC-13, No. 6, 12-1978, pp. 767-773.

*Primary Examiner*—Stanley D. Miller
*Assistant Examiner*—D. R. Hudspeth
*Attorney, Agent, or Firm*—Patrick T. King; Eugene H. Valet; Charles E. Krueger

[57] ABSTRACT

A low power, low output impedance, CMOS voltage reference with high source/sink current driving capability. A CMOS current mirror preamplifier includes matched transistor pairs having their W/L ratios scaled to reduce the level of current to the subthreshold region. A CMOS source follower output stage also has its transistors biased in the subthreshold region. Circuitry for protecting the preamplifier from the effects of supply voltage and output voltage bumps is also disclosed.

36 Claims, 8 Drawing Figures

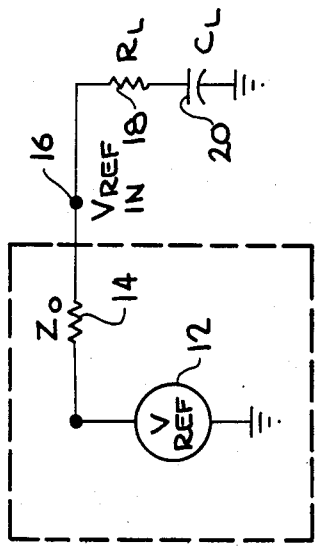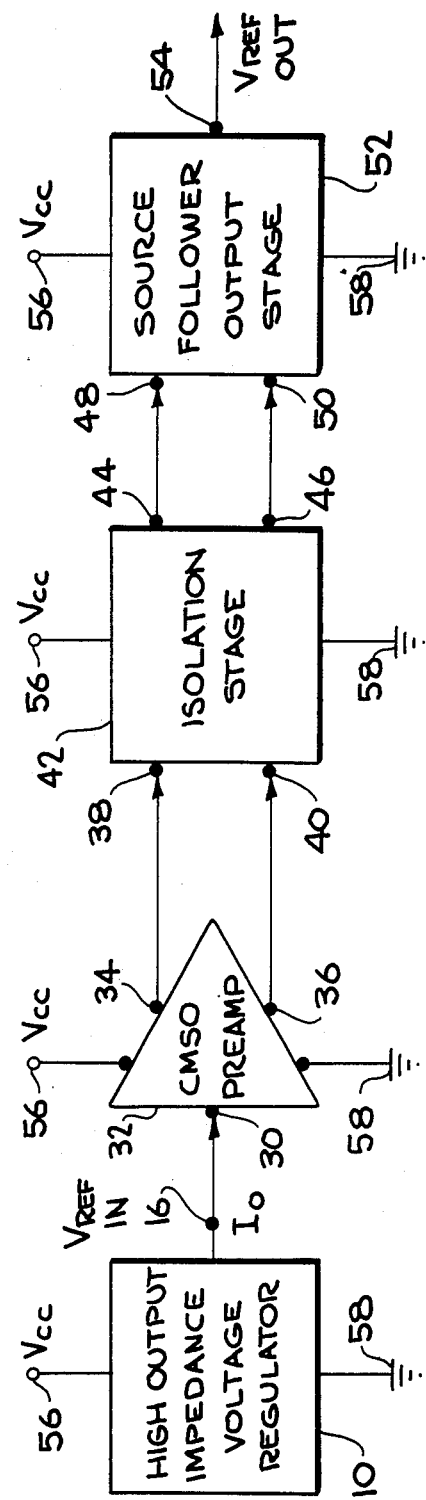

LOW POWER CMOS REFERENCE GENERATOR WITH LOW IMPEDANCE DRIVER

BACKGROUND OF THE INVENTION

1. Field of the Invention

The invention relates generally to low power voltage references and, more particularly, to low power reference drivers formed on an integrated circuit (IC) chip.

2. Description of the Prior Art

A regulated voltage source is required in many electronic systems. In systems fabricated on a semiconductor IC chip, the voltage reference has generally been implemented off the chip. On-chip voltage references have recently been developed and are described, for example, in an article by Tsividis et al., entitled "A CMOS Voltage Reference," IEEE J. Solid State Circuits, V. SC-13, No. 6, Dec. 1978, pp. 774-778, and an article by Blaushild entitled "A New NMOS, Temperature Stable Voltage Reference," IEEE J. Solid State Circuits, V. SC-13, No. 6, December 1978, pp. 767-773. However, neither of the voltage references described in these articles are characterized by low output impedance at low power.

The reference Tsividis et al., at page 774, described several advantages of a CMOS voltage reference. Among these advantages are that CMOS design places bipolar devices at the disposal of a circuit designer and, when operated in the subthreshold region, provides a temperature insensitive reference.

Recently, CMOS dynamic RAM ICs have been developed to reduce power consumption. It is of critical importance that the voltage reference utilized in these systems dissipates very low power so that the overall low power consumption of CMOS DRAM is not significantly degraded.

These IC memory circuit arrays, and many other IC systems, require a voltage reference driver capable of supplying a high level of current without changing the reference voltage. For example, in an IC memory array, this current is required to charge the bit lines and storage capacitors in the memory array to the required reference voltage. To achieve the characteristics of a good driver, the voltage reference must have a low output impedance.

The output impedance of the voltage reference and the load resistor form a resistive voltage divider circuit. If the driver is supplying current to the load then the output voltage from the driver will be decreased by an amount equal to the current multipled by the output impedance. Thus, a low output impedance is required to provide a stable voltage reference and to supply high current.

Additionally, a low output impedance voltage reference driver also provides for a low RC charging time where R is the output impedance of the voltage reference and C is the capacitance of the IC circuit. This low charging time is of critical importance to implementing high speed memory arrays and other IC high speed circuits.

Accordingly, a great need exists in the IC device industry for a low power, low output impedance, on-chip voltage reference.

SUMMARY OF THE INVENTION

The present invention is a CMOS, low power, low output impedance, on-chip, voltage reference. The invention includes a preamplifier coupled to the output terminal of a high output impedance on-chip voltage reference. This preamplifier includes a unique CMOS matched current mirror configuration that biases the MOS transistors of the preamplifier in the subthreshold region. Because the current flow in the subthreshold region is minimal, the preamplifier dissipates very low power. Additionally, this low current effectively isolates the output impedance of the high output impedance voltage reference. By preventing significant current flow into or out of the the high output impedance terminal, the deleterious effects associated with a high output impedance voltage reference, i.e., the fluctuation of the output voltage and the increase of the RC charge time constant, are reduced.

In one embodiment, the preamplifier provides output signals to a CMOS source follower output stage. The gain of the preamplifier/output stage configuration is approximately unity so that the magnitude of the output voltage, at the output terminal of the source follower output stage, is about equal to the magnitude of the voltage at the output terminal of the high output impedance voltage reference ($V_{REFIN}$). The output signals from the preamplifier bias the source follower transistors in the subthreshold region when no load is coupled to the source follower output terminal. Thus, during the no load state, the source follower draws very low current and dissipates low power. However, when a load is coupled to the output terminal the source follower provides high current.

An important characteristic of the source follower output stage is its low output impedance. Accordingly, the voltage at the output terminal of the source follower output stage ($V_{REFOUT}$) is approximately equal to the magnitude of $V_{REFIN}$, and, due to the low output impedance of the source follower output stage, the system of the present invention supplies driving current without changing the value of $V_{REFOUT}$ or causing an increase in the RC time constant required to charge an output load.

According to one aspect of the invention, the preamplifier includes a CMOS current mirror configuration with the output terminal of the high output impedance voltage reference connected to an input node in the current mirror configuration. The W/L ratios of the transistors are scaled to bias all the transistors in the subthreshold region. Thus, the magnitude of the source to drain current ($I_{SD}$) in the transistors is very low. The sources of complementary P channel and N channel transistors are interconnected at the input node and, due to the sub-threshold bias condition, substantially no current flows into or out of the output terminal of the high output impedance voltage reference.

The source follower output stage also includes NMOS and PMOS transistors designed so that their operating characteristics are matched with the transistors of the preamplifier. The W/L ratios of the channels in the transistors in the source follower output stage are scaled up from the W/L ratios of the transistors in the preamplifier to provide current drive capacity.

According to one aspect of the invention, the value of $V_{REFIN}$ is a predetermined fraction, for example ½, of the supply voltage $V_{CC}$. Circuitry is provided for preventing charge buildup on nodes of the CMOS current mirror from trapping the preamplifier voltage outputs at an incorrect level. In one embodiment, a charge pump prevents charge buildup. Additionally, capacitors for coupling the $V_{REFIN}$ input to the preamplifier output terminals are provided to prevent trapping.

In another embodiment of the invention, a CMOS isolation stage is utilized to couple the source follower output stage to the preamplifier. The transistors in the isolation stage are matched to the transistors in the preamplifier and are biased in the subthreshold region. The W/L ratios of the output stage transistors are scaled up from the W/L ratios of the transistors in the preamplifier to provide increased current to drive the output stage. Additionally, the isolation stage decouples the output feedback signal from the preamplifier.

BRIEF DESCRIPTION OF THE DRAWINGS

FIG. 1 is a schematic diagram of a high output impedance voltage reference.

FIG. 2 is a block diagram of an embodiment of the present invention.

DETAILED DESCRIPTION OF THE PREFERRED EMBODIMENT

Figure 3:
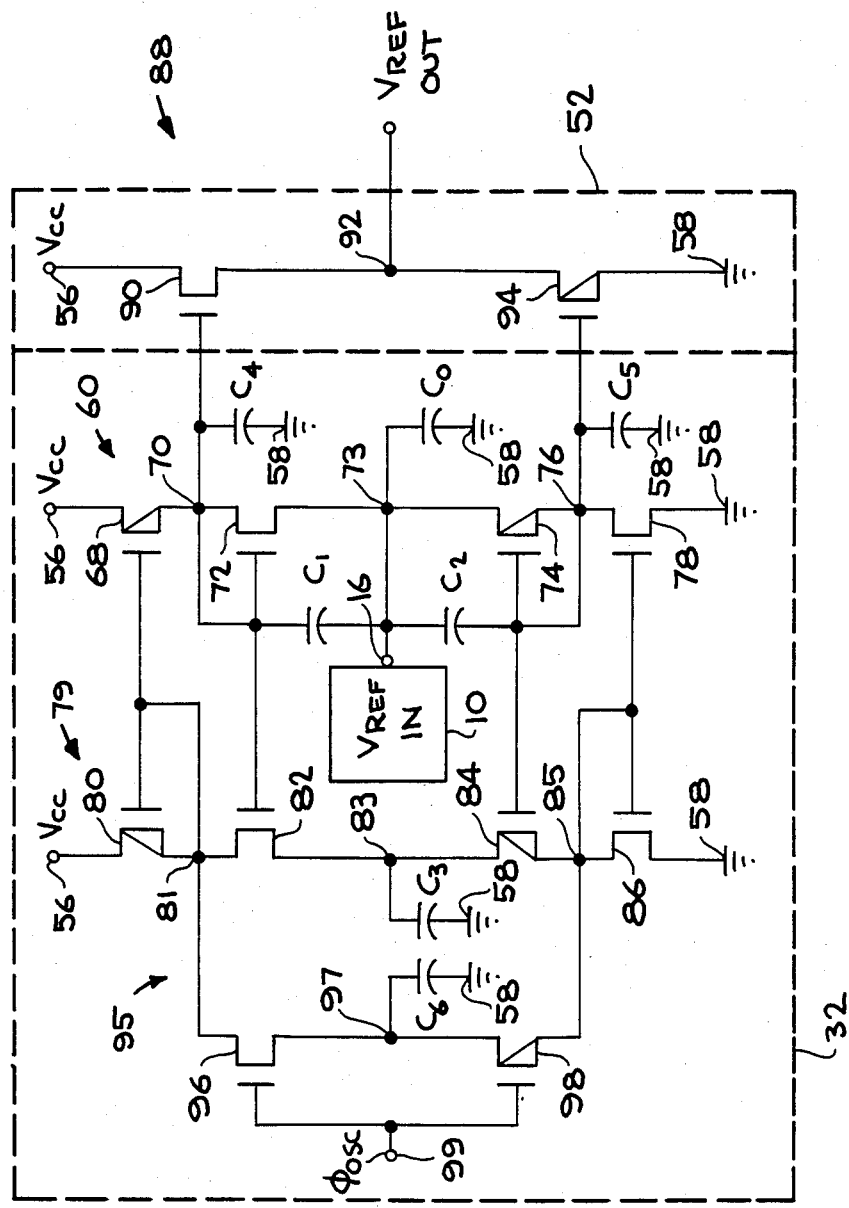
FIG. 3 is a circuit diagram of a preferred embodiment of the invention.

The present invention is an on-chip, low output impedance, CMOS reference voltage generator and current driver.

FIG. 1 is a schematic diagram of an equivalent circuit of a standard voltage reference. The voltage reference 10 is represented by an ideal voltage source 12 connected in series to the voltage reference output impedance ($Z_0$) 14. The reference voltage supplied by the voltage reference ($V_{REFIN}$) is provided at the reference source output terminal 16. The output terminal 16 is connected to a load which, in this figure, is represented by a load resistor ($R_L$) 18 and a load capacitor ($C_L$) 20.

In the context of the present invention, $R_L$ and $C_L$ 18 and 20 represent the resistance and capacitance of the bit lines and memory cells of an IC memory array. The disadvantages of high output impedance will now be described in this context. First, when current is being supplied through the load resistor 18 to charge the capacitor $C_L$, the resistive network formed by the output impedance $Z_0$ 14 and the load resistor $R_L$ 18 form a voltage dividing network. Accordingly, the value of $V_{REFIN}$ will differ from $V_{REF}$ by a term equal to the magnitude of the current supplied multiplied by the magnitude of the output impedance $Z_0$ 14. Thus, $V_{REFIN}$ will not have a stable value, but will fluctuate in proportion to the current supplied by the voltage reference 10. Secondly, the time to charge the load capacitor 20, $C_L$, depends on the sum of $Z_0$, and $R_L$ 14 and 18 and is increased in proportion to the magnitude of the output impedance, $Z_0$. Since, in this context, $C_L$ 20 represents the capacitance of the memory cells in a memory array, any increase in the time required to charge or discharge the capacitor, $C_L$ 20, slows down the access time of the memory, thereby decreasing its efficiency.

FIG. 2 is a block diagram of the invention. Referring now to FIG. 2, the output terminal 16 of the high output impedance voltage reference 10 is connected to the input 30 of a CMOS preamplifier 32. The CMOS preamplifier 32 generates first and second output signals at the first and second preamplifier outputs 34 and 36 which are coupled to the first and second input terminals 38 and 40 of an isolation stage 42. The isolation stage 42 generates first and second isolation stage output signals at first and second output terminals 44 and 46 which are coupled to the first and second input terminals 48 and 50 of a source follower output stage 52. The source follower output stage 52 generates an output signal at its output terminal 54. The highoutput impedance voltage reference 10, the preamplifier 32, the isolation stage 42, and source follower 52 are each coupled to the $V_{CC}$ and ground terminals 56 and 58 of an external power supply (not shown).

The CMOS preamplifier 32 is configured so that the virtually no current, $I_0$, flows into or out of the output terminal 16 of the high output impedance voltage reference 10. Thus, the above-described voltage fluctuations due to current flow through the output impedance is eliminated from the circuit. The isolation stage 42 protects the preamplifier 32 from the effects of a bump in the value of $V_{CC}$ and from output voltage fluctuations. The source follower output stage 52 provides a high output current and is characterized by an inherently low output impedance. The gain of the total system is approximately unity so that a stable $V_{REFOUT}$ equal in magnitude to $V_{REF}$ and a capability of providing a large driving current is realized by the system. In an alternative embodiment, the isolation stage is not included and the outputs 34 and 36 from the CMOS preamplifier 34 are connected directly to the inputs 48 and 50 of the source follower output stage 52. The system is designed to dissipate very lower when not providing driving current to an external load.

FIG. 3 is a circuit diagram of an embodiment of the invention with the isolation stage 42 omitted. Referring now to FIG. 3, a first series circuit 60 between the $V_{CC}$ terminal 56 and ground terminals 58 includes four MOS transistors. The first circuit 60 includes a first PMOS transistor 68 with its source connected to the $V_{CC}$ terminal 56 and its drain connected to a first node 70. The first node 70 is coupled to the drain terminal of a second NMOS transistor 72 and is also coupled to the gate of second transistor 72 while the source terminal of second transistor 72 is coupled to a second node 73. The output terminal 16 of the high output impedance voltage reference 10 is coupled to the second node 73 of the first circuit 60. Second node 73 is coupled to the source terminal of a third PMOS transistor 74 with the drain terminal of third transistor 74 connected to a third node 76 and also with the gate of third transistor 74 connected to third node 76. Finally, the drain terminal of a fourth NMOS transistor 78 is connected to third node 76 while the source terminal is connected to the ground terminal 58 of the external power supply.

The second transistor 72 is connected in a diode configuration. The voltage difference ($V_{DS}$) between the drain and source (first node 70 and second node 73) of second transistor 72 is equal to the voltage difference ($V_{GS}$) between the gate and source (second node 73) because the gate is coupled to the drain. The second transistor 72 will conduct when $V_{GS}$ is equal to $V_{TN}$ (the threshold voltage of the second NMOS transistor 72). Thus, when $V_{DS}$ is equal to $V_{TN}$ second transistor 72 conducts and holds the voltage at the first node 70, V(1), equal to $V_{REFIN}+V_{TN}$. Correspondingly, V(3) is equal to $V_{REF}-V_{TP}$ where $V_{TP}$ is the threshold voltage of third PMOS transistor 74.

The preamplifier 32 further includes a second series circuit 79. A fifth PMOS transistor 80 has its source terminal coupled to $V_{CC}$ terminal 56 and its drain terminal coupled to a fourth node 81. The fourth node 81 is coupled to the gates of first and fifth transistors 68 and 80. The fourth node 81 is coupled to the drain terminal of a sixth NMOS transistor 82 with the drain of sixth transistor 82 connected to a fifth node 83. The gate of the sixth transistor 82 is coupled to the first node 70. The fifth node 83 is coupled to the source terminal of a seventh PMOS transistor 84 with the drain terminal of the seventh transistor 84 coupled to a sixth node 85. The gate of the seventh transistor 84 is coupled to the third node 76. The sixth node 85 is coupled to the drain terminal of an eight NMOS transistor 86 with the source terminal of the eighth transistor 86 coupled to ground terminal 58. The sixth node 85 is coupled to the gates of the fourth and eighth transistors 78 and 86.

The characteristics of several MOS transistors fabricated on an IC may be closely matched if the various corresponding components of the matched transistors are formed during the same process step. For example, if all the drains are formed during a single ion implantation step any variations in the ion implantation rate would affect all the matched transistors equally. Thus, the threshold and gain characteristics of all the matched transistors would be nearly identical.

The drain to source current, $I_{DS}$, of an MOS transistor is dependent on the ratio of width to the length of the transistor channel. The magnitude of source-drain currents, $I_{DS}$, of identically biased matched transistors may be relatively scaled by scaling the channel W/L ratios of the transistors. For example, if the W/L ratio of the fifth PMOS transistor 80 were equal to N times the W/L ratio of the first PMOS transistor 68 and $I_{DS}(5)=N\ I_{DS}(1)$.

In the first and second series circuits 60 and 79 the first and fifth transistors 68 and 80, second and sixth transistors 72 and 82, third and seventh transistors 74 and 84, and fourth and eight transistors 78 and 86 are matched transistor pairs.

A third series circuit 88 connected between the $V_{CC}$ and ground terminals 56 and 58 functions as the source follower output stage 52 of FIG. 2. The third series circuit 88 includes a ninth NMOS transistor 90 with its drain terminal connected to the $V_{CC}$ terminal 56 and its source terminal connected to a seventh node 92. The seventh node 92 is connected to the source terminal of a tenth PMOS transistor 94 having its drain terminal connected to the ground terminal 58. The gate of the ninth transistor 90 is connected to the first node 70 of the first circuit 60 and, thus, the gate voltage of ninth transistor 90 is equal to $V_{REFIN}+V_{TN}$. Similarly, the gate of the tenth transistor 94 is connected to the third circuit node 76 and the voltage at the gate of tenth transistor 94 is equal to $V_{REFIN}-V_{TP}$. Note that first and third nodes 70 and 76 correspond to the first and second preamplifier outputs (34 and 36 of FIG. 2) and that the gates of ninth and tenth transistors 90 and 94 correspond to the source follower inputs (48 and 50 of FIG. 2).

The ninth and tenth transistors 90 and 94 are matched to the second and third transistors 72 and 74, respectively, in the first circuit 60 but W/L ratios are scaled up to provide high driving current at seventh node 92.

Capacitor $C_0$ couples the second node 73 to the ground terminal 58; capacitor $C_1$ couples the $V_{REFIN}$ terminal 16 to the first node 70; capacitor $C_2$ couples the $V_{REFIN}$ terminal 16 to the third node 76; capacitor $C_3$ couples the fifth node 83 to the ground terminal 58; capacitor $C_4$ couples the first node 70 to the ground terminal 58; and, capacitor $C_5$ couples the third node 76 to the ground terminal 58.

A fourth series circuit 95 couples the fourth node 81 to the sixth node 85. The fourth series circuit 95 includes an eleventh NMOS transistor 96 with its drain terminal connected to fourth node 81 and its source terminal connected to an eighth node 97. Eighth node 97 is connected to the source terminal of a twelfth PMOS transistor 98. The drain of twelfth transistor 98 is connected to the sixth node 85. The gates of eleventh and twelfth transistors 96 and 98 are coupled to a $\phi_{OSC}$ input 99. Capacitor $C_6$ couples the eighth node 97 to the ground terminal 58.

Figure 4:
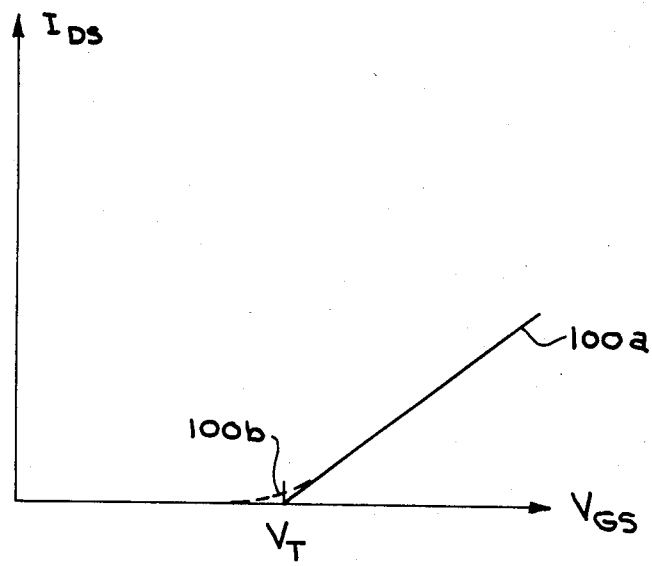
FIG. 4 is a graph depicting the dependence of $I_{DS}$ on $V_{GS}$.

The operation of the circuit depicted in FIG. 3 will now be described. All transistors in the first and second series circuits 60 and 79 are biased to operate in the subthreshold region. The drain/source current ($I_{DS}$) as a function of the gate/source voltage ($V_{GS}$) is depicted in FIG. 4. The first order dependence is depicted by the solid line 100a. Note that $I_{DS}$ is zero for $V_{GS}$ less than $V_T$ and rises rapidly as $V_{GS}$ increases beyond $V_T$. The second order dependence is depicted by the dotted line 100b. The scale of the dotted line is amplified to illustrate that the value of $I_{DS}$ is slightly greater than zero for $V_{GS}$ slightly less than $V_T$. This region where $V_{GS}$ is equal to or slightly less than $V_T$ is defined as the subthreshold region. Power dissipation in this region is very low because the value of $I_{DS}$ is very small and power dissipation depends on $(I_{DS})^2$.

The achievement of subthreshold biasing will now be described with reference to FIG. 5, which is a simplified depiction of the section of a circuit depicted in FIG. 3. In a preferred embodiment $V_{REFIN}$ is equal to $V_{CC}/2$. The voltage at the fifth node 83, V(5), is also equal to $V_{CC}/2$ for the reasons described below. The first, second, fifth, and sixth transistors 68, 72, 80 and 82 are connected to form a current mirror. If all the transistors had identical W/L ratios, then the current through the first and second circuits 60 and 79 would be equal for the following reasons. The $V_{GS}$ of the first and fifth transistors are both equal to $+V_{TP}$ because the gates of the fifth and first transistors 80 and 68 are coupled to the fourth node 81 and the sources of both transistors are coupled to the $V_{CC}$ terminal 56. The drain source current amplitudes, $I_{DS}(1)$ and $I_{DS}(5)$, through the first and fifth transistors 68 and 80 are both equal if the W/L ratios of the transistors are equal because the first and fifth transistors 68 and 80 are a matched transistor pair. Similarly, $V_{GS}$ of the second and sixth transistors 72 and 82 are both equal to $-V_{TN}$ and the magnitudes of $I_{DS}(2)$ and $I_{DS}(6)$ are equal. Finally, $I_{DS}(1)$ is equal to $I_{DS}(2)$ because the first and second transistors 68 and 72 are connected in series and $I_{DS}(5)$ and $I_{DS}(6)$ are equal because the fifth and sixth transistors 80 and 82 are connected in series. The net result is that the current in both the first and second series circuits 60 and 79 is equal.

In the present invention, the W/L ratios for the second and sixth transistors 72 and 82 are equal, but the ratio for the first transistor 68 is scaled down to a fraction, for example ¼th, of the ratio for the fifth transistor 80. Accordingly, the value of $I_{DS}(1) = \frac{1}{4} I_{DS}(5)$. The first and second transistors 68 and 72 are connected in series so that $I_{DS}(2) = I_{DS}(1) = \frac{1}{4} I_{DS}(5)$. As described above, the second and sixth transistors 72 and 82 are matched transistors with the same W/L ratio and have the same $V_{GS}$ so that $I_{DS}(4) = I_{DS}(6) = \frac{1}{4} I_{DS}(5)$. And, since fifth and sixth transistors 80 and 82 are connected in series, $I_{DS}(5) = I_{DS}(6) = \frac{1}{4} I_{DS}(5)$.

Figure 5:
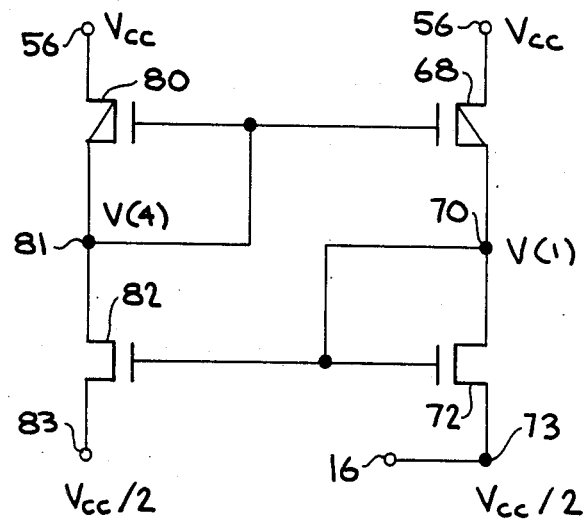
FIG. 5 is a circuit diagram of a section of the circuit depicted in FIG. 3.

Thus the circuit of FIG. 5 forms a feedback loop to keep decreasing the current in the current mirror until the transistors are biased in the subthreshold region.

Referring back now to FIG. 3, note that the voltage at the first node 70, V(1), is equal to $V_{REF} + V_{TNS}$ where $V_{TNS}$ indicates that the second transistor 72 is biased in the subthreshold region. Similarly, the voltage at the third node 76, V(3), is $V_{REF} - V_{TPS}$. In the embodiment depicted in FIG. 3, the voltages V(1) and V(3) are the output voltages of the preamplifier stage 32.

The ninth and tenth transistors 90 and 94 of the source follower stage 52 are matched to the second and third transistors 72 and 74, respectively, but have increased W/L ratios to provide high driving current.

The magnitude of the voltage at the $V_{REFOUT}$ output terminal 92 is equal to $V_{REFIN}$ for the following reasons:

(a) If the ninth transistor 90 is to conduct, then $$V_{GS} = V_{Gate} - V_{source} = V_{REFIN} + V_T - V_{REFOUT} \geq V_T$$

assuming the magnitudes of $V_{TNS}$ and $V_{TPS}$ are equal to $V_T$ (b) If the tenth transistor 94 is to conduct, then $$V_{GS} = V_{GATE} - V_{Source} = V_{REFIN} - V_T - V_{REFOUT} \leq V_T$$

and (c) if both the ninth and tenth transistors 90 and 94 are to conduct, then $$V_{REFIN} = V_{REFOUT}$$

The voltage at the third node 73, V(3), is equal to $V_{REFIN}$ for the same reasons.

The ninth and tenth transistors 90 and 94 have their gates coupled to first node 70 and third node 76, respectively, and their sources coupled to $V_{REFOUT}$ terminal 92. Thus, matched second transistor 72 and ninth transistor 90 have the same $V_{GS}$ and are therefore both biased in the subthreshold region. Accordingly, virtually no power is dissipated in the no load state due to the low value of the current flowing through the circuit in the subthreshold bias region. However, when a load is coupled to the output terminal 92 the source follower 52 provides high source/sink current drive due to the high W/L ratios of the ninth and tenth transistors 90 and 94.

Figure 6:
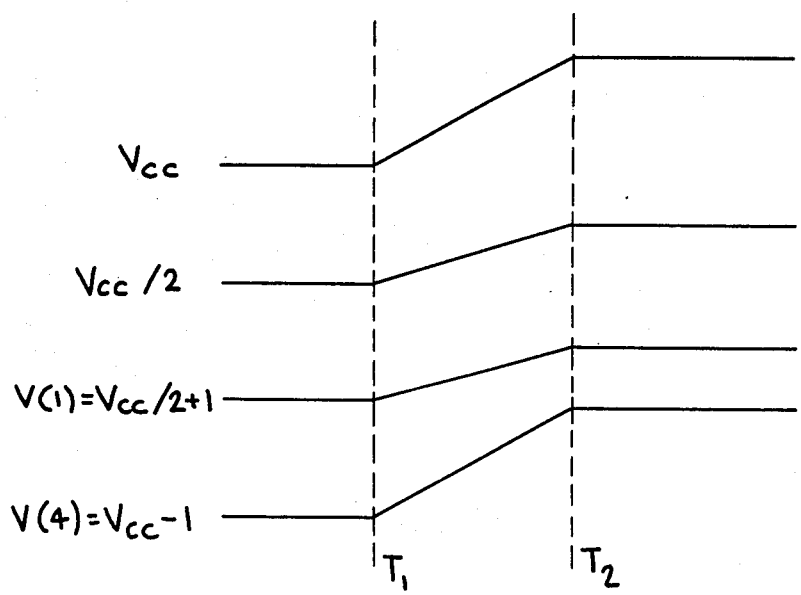
FIG. 6 is a timing diagram illustrating the effects of a $V_{CC}$ bump.

A significant problem with the simplified circuit depicted in FIG. 5 develops in the case where the level of $V_{CC}$ bumps from a first to a second value. In that case, the preamplifier output voltages developed at first node 70 and third node 76 may be trapped at an intermediate value and not follow the value of $V_{REFIN} = V_{CC}/2$. The trapping of first node 70 at a low voltage value for a positive value of the $V_{CC}$ bump will now be described with reference to FIG. 5 and FIG. 6. FIG. 6 is a timing diagram depicting the magnitudes of $V_{CC}$, $V_{REFIN} = V_{CC}/2$, V(4), and V(1). This graph is exemplary only and does not depict the actual time dependence of the various functions. In this example, $V_{CC}$ bumps from four volts to six volts, $V_{REFIN} = V_{CC}/2$ bumps from two volts to three volts, and the magnitudes of $V_{TNS}$ and $V_{TPS}$ are set equal to one. The $V_{CC}$ bump starts at time $T_1$ and ends at time $T_2$.

Referring now to FIGS. 5 and 6, note that in the time period from $T_1$ to $T_2$ $V_{CC}$ bumps from four to six volts and $V_{CC}/2$ bumps from two to three volts. Since the change in magnitude of $V_{CC}/2$ is less than the change of magnitude in $V_{CC}$ the slope of the curve representing $V_{CC}/2$ is less than the slope of the curve representing $V_{CC}$. As described above, V(4) is equal to $V_{CC} - 1$ and, thus, V(4) increases at the same rate as $V_{CC}$. The $V_{CC}$ bump increases the current in the fourth transistor 80, $I_{DS}(4)$, above the subthreshold level and charges the fourth node 81. This charging increases V(4) and turns off the first transistor 68. The resulting current flow through the first transistor 68, $I_{DS}(1)$, is so small that the first node 70 remains trapped at 3 volts, the original $V_{CC}/2 + 1$. With V(1) at 3 volts and the fifth node 83 at 2 volts, the original $V_{CC}/2$ value, the fifth transistor 82 remains biased in the subthreshold region. This small subthreshold current, $I_{DS}(5)$, is insufficient to discharge the fourth node 81 and in turn the first transistor 68 to untrap the first node 70. A similar problem exists at the sixth node 85 in the case of a negative $V_{CC}$ bump.

The circuit depicted in FIG. 3 includes two mechanisms for preventing charge build up at the fourth and sixth nodes 81 and 85 and the trapping of the first and third nodes 70 and 76. The first is a charge pump circuit formed by the fourth series circuit 95. The second mechanism is a capacitive coupling network formed by capacitors C1, C2, and C3.

Referring first to the charge pumping circuit 95 of FIG. 3, the eleventh transistor 96 transfers a small amount of charge between the fourth node 81 and capacitor C6 when the value of $\phi_{OSC}$ goes high. This charge is then transferred from capacitor C6 to the sixth node 85 when the value of $\phi_{OSC}$ goes low. The value of C6 is selected so that the average value fo the current flowing through the charge pump circuit 95 is on the order of several nanoamps. Thus, the power dissipation of the overall circuit is not increased by the presence of the charge pump circuit 95.

Turning now to the capacitive coupling network, the capacitor C1, coupling the $V_{REFIN}$ terminal 16 to the first node 70, and C$_0$, coupling the fifth node 83 to the ground terminal 56, form part of a feedback loop for untrapping the first node 70. The operation will be described for the case, set forth above, where the first node 70 is trapped at 3 volts during a $V_{CC}$ bump from 4 volts to 6 volts.

When $V_{CC}$ bumps from 4 to 6 volts $V_{CC}/2$ bumps from 2 to 3 volts, capacitor C1 partially couples this $V_{CC}/2$ voltage bump to the first node 70. Therefore, V(1) increases to 3 volts plus a small increment. The increase in V(1) increases the current through the sixth transistor 82 partially discharges the fourth node 81. The current through the sixth transistor 82 is sunk by the large capacitor C3.

The reduction of charge on the fourth node 81 decreases V(4) from 5 volts to 5 volts minus a small increment. This decrease in V(4) increases the current through the first transistor 68 and charges the first node to a higher voltage. This increase in V(1) continues the feedback described above.

The large capacitor $C_0$ settled the circuit and stops the feedback process when the nodes are at the correct voltage levels.

The capacitors $C_4$ and $C_5$ decouple the first and third nodes 70 and 76 from the effects of output voltage bumps.

Figure 7:
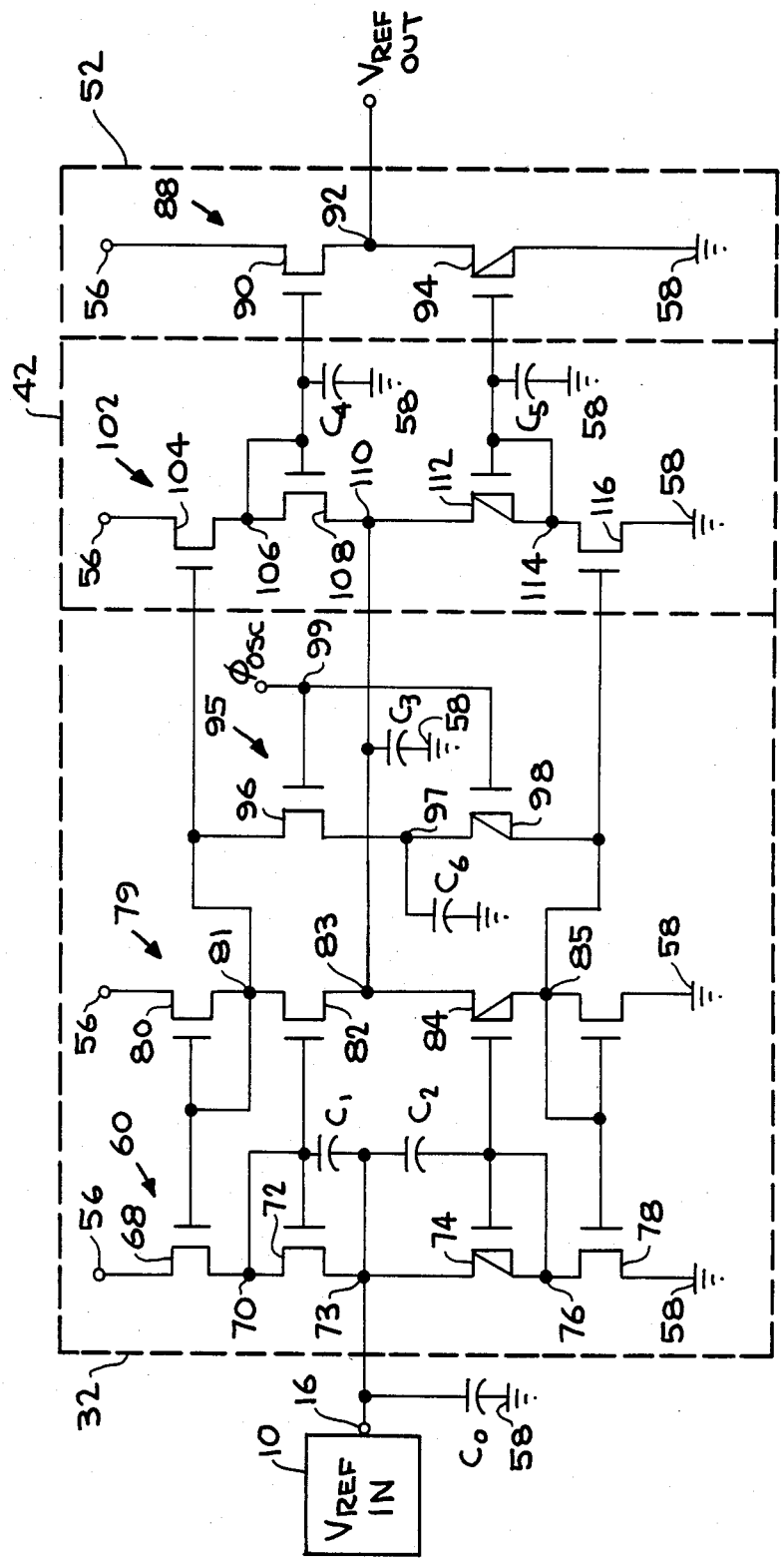
FIG. 7 is a circuit diagram of an embodiment of the invention including an isolation stage.

The circuit depicted in FIG. 7 corresponds to the circuit of FIG. 3 with the addition of the isolation stage 42 of FIG. 1. Referring now to FIG. 7, identical or corresponding circuit elements depicted in FIG. 3 are given the same reference numerals in FIG. 7.

A fifth series circuit 102 interconnects the preamplifier 32 to the source follower output stage 52. This fifth circuit 102 includes a thirteenth PMOS transistor 104 having its source terminal connected to $V_{CC}$ terminal 58 and its drain terminal connected to a ninth node 106. The gate of the thirteenth transistor 104 is coupled to the fourth node 81. A fourteenth NMOS transistor 108 has its drain terminal connected to the ninth node 106 and its source terminal connected to a tenth node 110. The fourteenth transistor 108 is connected in the diode configuration with its gate coupled to ninth node 106. A fifteenth PMOS transistor 112 has its source terminal connected to the tenth node 110 and its drain terminal connected to an eleventh node 114. The fifteenth transistor 112 is connected in the diode configuration with its gate coupled to the eleventh node 114. Finally, a sixteenth NMOS transistor 116 has its drain terminal coupled to the eleventh node 114 and its source terminal coupled to the ground terminal 58. The gate of the sixteenth transistor 116 is coupled to the sixth node 85. Note that positions of the first and second series circuits 60 and 79 in FIG. 8 have been interchanged relative to their positions in FIG. 3.

The gates of the thirteenth and sixteenth transistors 104 and 116 correspond to the isolation stage inputs (38 and 40 of FIG. 2) and the ninth and eleventh nodes 106 and 114 correspond to the isolation stage outputs (44 and 46 of FIG. 2). In this circuit the first and third nodes 70 and 76 correspond to the preamplifier outputs (34 and 36 of FIG. 2).

The thirteenth, fourteenth, fifteenth, and sixteenth transistors 104, 108, 112, and 116 in the isolation stage circuit 102 form matched pairs with the first, second, third, and fourth transistors 68, 72, 74, and 78 in the preamplifier 32. Additionally, the ninth and fourteenth transistors 90 and 108 and tenth and fifteenth transistors 94 and 114 form matched pairs. However, the W/L ratios of the thirteenth, fourteenth, fifteenth, and seventeenth transistors 104, 108, 112, and 116 are scaled up relative to the transistors in the preamplifier 32 so that more current flows in the isolation stage circuit 102. Also, the W/L ratios in the transistors 90 and 94 in the source follower circuit 88 are scaled up from the transistors in the isolation stage 42. The magnitude of the voltage at the fifth and tenth coupled nodes 83 and 110 is equal to $V_{REFIN}$ for the reasons set forth above.

The isolation stage series circuit 102 mirrors the first series circuit 79. In particular, the ninth and eleventh nodes 106 and 114 mirror the first and third nodes 70 and 76, respectively. The increased scale of the W/L ratios of the transistors in the fifth series circuit 102 provide increased current to charge the ninth and eleventh nodes 106 and 114 and to diminish the effects of $V_{CC}$ bump and output bounce on the circuit.

Figure 8:
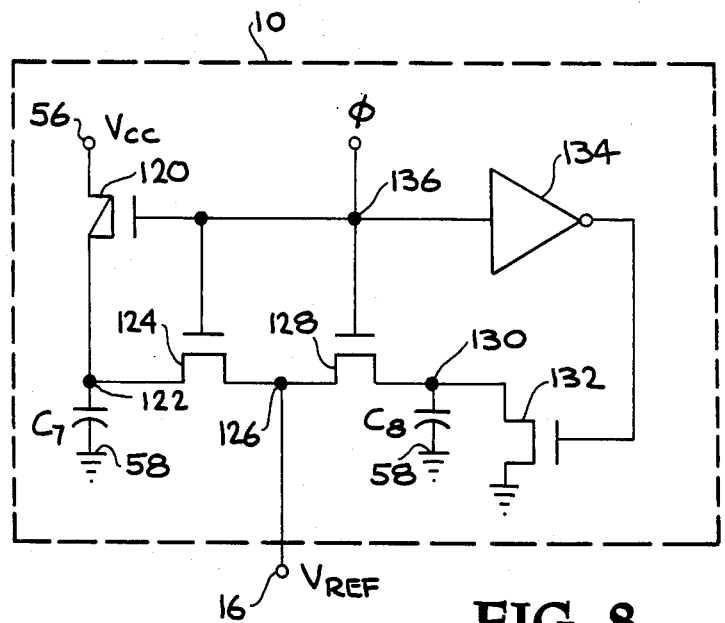
FIG. 8 is a schematic diagram of a high output impedance on-chip voltage reference.

FIG. 8 is a circuit diagram of an exemplary high output impedance voltage reference suitable for use with the present system. A PMOS transistor 120 has its source terminal connected to the $V_{CC}$ terminal 56 and its drain terminal connected to node 122. Capacitor $C_7$ is connected between node 122 and the ground terminal 58. An NMOS transistor 124 has its drain temrinal connected to node 122 and its source terminal connected to node 126 and an NMOS transistor 128 has its source terminal connected to node 126 and its drain temrinal connected to node 130. Capacitor $C_8$ is connected between node 130 and the ground terminal 58. An NMOS transistor 132 has its drain terminal connected to node 130 and its source terminal connected to ground terminal 58. An inverter 134 has its input connected to node 136 and its output connected to the gate of transistor 132. The gates of transistors 120, 124, and 128 are connected to node 136.

In operation, a periodic clock signal, $\phi$, that alternates between 0 and $V_{CC}$ is applied to node 136. When the clock signal amplitude is equal to $V_{CC}$, transistors 120 and 132 are on and transistors 124 and 128 are off. Accordingly, capacitor $C_7$ charges to $+V_{CC}$ through transistor 120 and capacitor $C_8$ discharges to ground through transistor 132. When the clock signal amplitude is equal to 0, transistors 120 and 132 are turned off and transistors 124 and 128 are on. Thus, node 126 is coupled to capacitor $C_7$ and $C_8$. The values of $C_7$ and $C_8$ are set equal so that the sum of the voltages at node 126 is equal to $V_{CC}/2$. Node 126 is coupled to the output terminal 16 of the high output impedance voltage reference 10.

The invention has been explained with respect to specific embodiments. Other embodiments will now be apparent to those of ordinary skill in this art. For example, the invention may be practiced in bipolar rather than CMOS technology. Matched pairs of PNP and NPN may be substituted for the CMOS and NMOS transistors described above. Current scaling is achieved by scaling the base areas of the bipolar transistors.

Additionally, subthreshold biasing was accomplished by scaling the W/L ratios of specified transistors. However, these W/L ratios may be arbitrarily scaled as long as the feedback reduces the current.

Further, $V_{REFIN}$ was set equal $V_{CC}/2$, however, $V_{REFIN}$ may assume any value between the absolute value of $V_{TP}$ and $V_{CC}-V_{TN}$.

Still further, the charge transfer circuit need not be a charge pump circuit but could be a large resistor.

Accordingly, it is therefore not intended that the invention be limited except as indicated by the appended claims.

What is claimed is:

1. A low power, low output impedance on-chip voltage reference with high current dirve capability for accepting a $V_{REFIN}$ signal from the output terminal of a high output impedance voltage reference and for providing a $V_{REFOUT}$ signal where the magnitude of $V_{REFOUT}$ is about equal to the magnitude of $V_{REFIN}$, said low output impedance voltage reference comprising:

a preamplifier, including a first plurality of interconnected transistors, having an input terminal coupled to the output terminal of the high output impedance voltage reference, with said preamplifier for preventing a substantial amount of current from flowing into or out of the output terminal of said high output impedance voltage reference and for providing first and second preamplifier output signals at first and second preamplifier output terminals, respectively;

a source follower output stage, including a second plurality of interconnected transistors, having first and second inputs coupled to said first and second preamplifier outputs, respectively, and for providing the $V_{REFOUT}$ signal at an output stage output terminal and for providing a high source/sink current driving capability and low output impedance; and means for biasing the transistors in said first and second plurality in the subthreshold region to minimize power dissipation.

2. The invention of claim 1 wherein said means for biasing comprises:

a current mirror being a circuit including the transistor in said first plurality.

3. The invention of claim 2 wherein said current mirror includes a matched pair of transistors.

4. The invention of claim 3 wherein said transistors in said matched pair are scaled to reduce the current flow in said current mirror to the sub-threshold level.

5. A low power, low output impedance on-chip voltage reference with high current drive capability for accepting a $V_{REFIN}$ signal from the output terminal of a high output impedance voltage reference and for providing a $V_{REFOUT}$ signal where the magnitude of $V_{REFOUT}$ is about equal to the magnitude of $V_{REFIN}$, said low output impedance voltage reference comprising:

a preamplifier, including a first plurality of interconnected transistors, having an input terminal coupled to the output terminal of the high output impedance voltage reference, with said preamplifier for preventing a substantial amount of current from flowing into or out of the output terminal of said high output impedance voltage reference and for providing first and second preamplifier output signals at first and second preamplifier output terminals, respectively;

an isolation stage, including a second plurality of interconnected transistors, having first and second inputs coupled to said first and second preamplifier outputs and first and second output terminals, said isolation stage for isolating said preamplifier from the effects of an output voltage bounce and for increasing the current driving capability of the voltage reference;

a source follower output stage, including a third plurality of interconnected transistors, having first and second inputs coupled to said first and second isolation stage outputs, respectively, and for providing the $V_{REFOUT}$ signal at an output stage output terminal and for providing a high source/sink current driving capability and low output impedance; and means for biasing the transistors in said first, second and third pluralities in the sub-threshold region to minimize power dissipation.

6. The invention of claim 5 wherein said means for biasing comprises:

a current mirror being a circuit including the transistors in said first plurality.

7. The invention of claim 6 wherein said current mirror includes a matched pair of transistors.

8. The invention of claim 7 wherein said transistors in said matched pair are scaled to reduce the current flow in said current mirror to the sub-threshold level.

9. A low power, low output impedance on-chip CMOS voltage reference with high current drive capability for accepting a $V_{REFIN}$ signal from the output terminal of a high output impedance voltage reference and for providing a $V_{REFOUT}$ signal where the magnitude of $V_{REFOUT}$ is about equal to the magnitude of $V_{REFIN}$, said low output impedance voltage reference comprising:

a CMOS preamplifier, including a first plurality of interconnected PMOS and NMOS transistors, having an input terminal coupled to the output terminal of the high output impedance voltage reference, with said preamplifer for preventing a substantial amount of current from flowing into or out of the output terminal of said high output impedance voltage reference and for providing first and second preamplifier output signals at first and second preamplifier output terminals, respectively;

a CMOS source follower output stage, including a second plurality of interconnected PMOS and NMOS transistors, having first and second inputs coupled to said first and second preamplifier outputs, respectively, and for providing the $V_{REFOUT}$ signal at an output stage output terminal and for providing a high source/sink current driving capability and low output impedance; and means for biasing the transistors in said first and second plurality in the subthreshold region to minimize power dissipation.

10. The invention of claim 9 wherein said means for biasing comprises:

a CMOS current mirror being a circuit including the transistors in said first plurality.

11. The invention of claim 10 wherein said current mirror includes a matched pair of transistors.

12. The invention of claim 11 wherein the W/L ratios of the transistors in said matched pair are scaled to reduce the current flow in said current mirror to the subthreshold level.

13. The invention of claim 12 wherein said low output impedance voltage reference is connected to the $V_{CC}$ and ground terminals of an external power supply, and where said CMOS current mirror includes first and second interconnected series circuits with said first circuit comprising:

a first PMOS transistor having its source terminal connected to the $V_{CC}$ terminal and its drain terminal connected to a first circuit node;

A second NMOS transistor having its drain terminal connected to said first circuit node and its source terminal connected to a second circuit node with the output terminal of said high output impedance voltage reference also coupled to said second circuit node;

a third PMOS transistor having its source terminal connected to said second circuit node and its drain terminal connected to a third circuit node;

a fourth NMOS transistor having its drain terminal connected to said third circuit node and its source connected to the ground terminal;

with said second NMOS transistor being connected in the diode configuration with its gate connected to said first circuit node;

with said third PMOS transistor being connected in the diode configuration with its gate connected to said third circuit node;

and with said second series circuit comprising:

a fifth PMOS transistor having its source terminal coupled to the $V_{CC}$ terminal and its drain terminal connected to a fourth circuit node, with said fourth circuit node being coupled to the gate of said first transistor;

a sixth NMOS transistor having its drain terminal connected to said fourth circuit node and its source terminal connected to a fifth circuit node, with the gate of said sixth transistor coupled to said first node;

a seventh PMOS transistor having its source terminal connected to said fifth node and its drain terminal connected to a sixth circuit node, with the gate of said seventh transistor coupled to said third node;

an eighth NMOS transistor having its drain terminal connected to said sixth node and its source terminal connected to the ground terminal, with said sixth node being coupled to the gate of said fourth transistor;

with said fifth PMOS transistor being connected in the diode configuration with its gate connected to said fourth circuit node;

with said eighth NMOS transistor being connected in the diode configuration with its gage connected to said sixth circuit node;

with said first and fifth, second and sixth, third and seventh, and fourth and eighth transistors being matched transistor pairs; and with said first and third nodes being the first and second preamplifier output terminals.

14. The invention of claim 13 wherein the W/L ratios of said first and fifth and fourth and eighth transistors are scaled to reduce the current flowing through said first and second circuits to the sub-threshold level.

15. The invention of claim 14 wherein the magnitude of $V_{REFIN}$ is between the absolute value of $V_{TP}$ and $V_{CC}-V_{TN}$.

16. The invention of claim 15 further comprising:
means for preventing the trapping of the first and third nodes at an incorrect output state when $V_{CC}$ bumps from a first to a second level.

17. The invention of claim 16 wherein said means for preventing comprises:
a first capacitor, $C_1$, coupling the output terminal of the high output impedance voltage reference to said first node;
a second capacitor, $C_2$, coupling the output terminal of the high output impedance voltage reference to said third node; and
a third capacitor, $C_3$, coupling said fifth node to the ground terminal.

18. The invention of claim 16 wherein said means for preventing comprises:
means for transferring charge between said fourth and sixth nodes.

19. The invention of claim 18 wherein said means for transferring comprises:
a charge pump circuit connecting said fourth and sixth nodes.

20. The invention of claim 16 wherein said output stage is a series circuit comprising:
a ninth NMOS transistor having its drain terminal connected to the $V_{CC}$ terminal, its source terminal connected to a seventh circuit node, and its gate connected to said first circuit node;
a tenth PMOS transistor having its source terminal connected to said seventh circuit node, its drain terminal connected to the ground terminal, and its gate connected to said third circuit node;

with said second and ninth transistors being a matched transistor pair and with said third and said tenth transistors being a matched transistor pair, and with the W/L ratio of said ninth and tenth transistors being scaled up from the W/L ratios of said third and fourth transistors.

21. The invention of claim 20 further comprising:
means for isolating said first and third nodes from the effects of an output voltage bounce.

22. The invention of claim 21 wherein said means for isolating comprises:
a fourth capacitor, $C_4$, coupling said first node to the ground terminal; and
a fifth capacitor, $C_5$, coupling said third node to the ground terminal.

23. A low power, low output impedance on-chip CMOS voltage reference with high current drive capability for accepting a $V_{REFIN}$ signal from the output terminal of a high output impedance voltage reference and for providing a $V_{REFOUT}$ signal where the magnitude of $V_{REFOUT}$ is about equal to the magnitude of $V_{REFIN}$, said low output impedance voltage reference comprising:

a CMOS preamplifier, including a first plurality of interconnected PMOS and NMOS transistors, having an input terminal coupled to the output terminal of the high output impedance voltage reference, with said preamplifier for preventing a substantial amount of current from flowing into or out of the output terminal of said high output impedance voltage reference and for providing first and second preamplifier output signals at first and second preamplifier output terminals, respectively;

a CMOS isolation stage, including a second plurality of interconnected PMOS and NMOS transistors, having first and second inputs coupled to said first and second preamplifier outputs and first and second output terminals, said isolation stage for isolating said preamplifier from the effects of an output voltage bounce and for increasing the current driving capability of the voltage reference;

a CMOS source follower output stage, including a third plurality of interconnected PMOS and NMOS transistors, having first and second inputs coupled to said first and second isolation stage outputs, respectively, and for providing the $V_{REFOUT}$ signal at an output stage output terminal and for providing a high source/sink current driving capability and low output impedance; and means for biasing the transistors in said first, second and third pluralities in the sub-threshold region to minimize power dissipation.

24. The invention of claim 23 wherein said means for biasing comprises:
a CMOS current mirror being a circuit including the transistors in said first plurality.

25. The invention of claim 24 wherein said current mirror includes a matched pair of transistors.

26. The invention of claim 25 wherein the W/L ratios of the transistors in said matched pair are scaled to reduce the current flow in said current mirror to the subthreshold level.

27. The invention of claim 26 wherein said low output impedance voltage reference is connected to the $V_{CC}$ and ground terminals of an external power supply, and where said CMOS current mirror includes first and second interconnected series circuits with said first circuit comprising:
- a first PMOS transistor having its source terminal connected to the $V_{CC}$ terminal and its drain terminal connected to a first circuit node;
- a second NMOS transistor having its drain terminal connected to said first circuit node and its source terminal connected to a second circuit node with the output terminal of said high output impedance voltage reference also coupled to said second circuit node;
- a third PMOS transistor having its source terminal connected to said second circuit node and its drain terminal connected to a third circuit node;
- a fourth NMOS transistor having its drain terminal connected to said third circuit node and its source connected to the ground terminal;
- with said second NMOS transistor being connected in the diode configuration with its gate connected to said first circuit node;
- with said third PMOS transistor being connected in the diode configuration with the gate of said transistor connected to said third circuit node;

and with said second series circuit comprising:
- a fifth PMOS transistor having its source terminal coupled to the $V_{CC}$ terminal and its drain terminal connected to a fourth circuit node, with said fourth circuit node being coupled to the gate of said first transistor;
- a sixth NMOS transistor having its drain terminal connected to said fourth circuit node and its source terminal connected to a fifth circuit node, with the gate of said sixth transistor coupled to said first node;
- a seventh PMOS transistor having its source terminal connected to said fifth node and its drain terminal connected to a sixth circuit node, with the gate of said seventh transistor coupled to said third node;
- an eighth NMOS transistor having its drain terminal connected to said sixth node and its source terminal connected to the ground terminal, with said sixth node being coupled to the gate of said fourth transistor;
- with said fifth PMOS transistor being connected in the diode configuration with its gate connected to said fourth circuit node;
- with said eighth NMOS transistor being connected in the diode configuration with its gage connected to said sixth circuit node;
- with said first and fifth, second and sixth, third and seventh, and fourth and eighth transistors being matched transistor pairs; and
- with said first and third nodes being the first and second preamplifier output terminals.

28. The invention of claim 27 wherein said output stage is a series circuit comprising:
- a ninth NMOS transistor having its drain terminal connected to the $V_{CC}$ terminal, and its source terminal connected to a seventh circuit node, and with said seventh node being the output terminal of said source follower; and
- a tenth PMOS transistor having its source terminal connected to said seventh circuit node, and its drain terminal connected to the ground terminal.

29. The invention of claim 28 further comprising:
means for preventing the trapping of the first and third nodes at an incorrect output state when $V_{CC}$ bumps from a first to a second level.

30. The invention of claim 29 wherein said means for preventing comprises:
- a first capacitor, $C_1$, coupling the output terminals of the high output impedance voltage reference to said first node;
- a second capacitor, $C_2$, coupling the output terminals of the high output impedance voltage reference to said third node;
- a third capacitor, $C_3$, coupling said fifth node to the ground terminal.

31. The invention of claim 30 wherein said means for preventing comprises:
means for transferring charge between said fourth and sixth nodes.

32. The invention of claim 31 wherein said means for transferring comprises:
- a charge pump circuit connecting said fourth and sixth nodes:
- said charge pump comprising: and eleventh NMOS transistor having its drain terminal connected to said fourth circuit node, and its source terminal connected to an eighth circuit node;
- a twelfth PMOS transistor having its source terminal connected to said eighth circuit node, and its drain terminal connected to said sixth circuit node;
- with the gates of said eleventh and twelfth transistors being connected to receive a charge pump signal, $\phi_{OSC}$.

33. The invention of claim 32 further including an isolation stage being a series circuit comprising:
- a thirteenth PMOS transistor having its source terminal connected to the $V_{CC}$ terminal, its drain terminal connected to a ninth circuit node, and its gate connected to said fourth circuit node;
- a fourteenth NMOS transistor having its drain terminal connected to said ninth circuit node and its source terminal connected to a tenth circuit node;
- a fifteenth PMOS transistor having its source terminal connected to said tenth circuit node and its drain terminal connected to an eleventh circuit node;
- a sixteenth NMOS transistor having its drain terminal connected to said eleventh circuit node, its source terminal coupled to the ground terminal, and its gate coupled to said sixth circuit node;
- with said fourteenth transistor connected in the diode configuration with its gate connected to said ninth circuit node;
- with the fifteenth transistor connected in the diode configuration with its gate coupled to said eleventh circuit node;
- with said first and thirteenth transistors, said second and fourteenth transistors, said third and fifteenth transistors, and said fourth and sixteenth transistors being matched transistor pairs;
- with said ninth and eleventh nodes being the first and second output terminals of said isolation stage;
- with said ninth node being coupled to the gate of said ninth transistor and said eleventh node being coupled to the gate of said tenth transistors, the gates of said ninth and tenth transistors being the input terminals of said source-follower;
- with said ninth and fourteenth and tenth and fifteenth transistors being matched transistor pairs; and
- with the W/L ratios of said ninth and tenth transistors being scaled up relative to the W/L ratios of the thirteenth and fifteenth transistors.

34. The invention of claim 33 wherein the W/L ratios of said first and fifth and fourth and eighth transistors are scaled to reduce the current flow through said first and second circuits to the sub-threshold level.

35. The invention of claim 34 wherein the magnitude of $V_{REFIN}$ is between the absolute value of $V_{TP}$ and $V_{CC}-V_{TN}$.

36. The invention of claim 35 wherein said isolation circuit further comprises:
   a fourth capacitor, $C_4$, coupling said ninth node to the ground terminal; and
   a fifth capacitor, $C_5$, coupling said eleventh node to the ground terminal;
   with $C_4$ and $C_5$ for decoupling output bounce.

* * * * *